(12) United States Patent
Sforzin et al.

(10) Patent No.: US 11,157,202 B2
(45) Date of Patent: Oct. 26, 2021

(54) MEMORY MANAGEMENT UTILIZING BUFFER RESET COMMANDS

(71) Applicant: Micron Technology, Inc., Boise, ID (US)

(72) Inventors: Marco Sforzin, Cernusco sul Naviglio (IT); Paolo Amato, Treviglio (IT)

(73) Assignee: Micron Technology, Inc., Boise, ID (US)

( * ) Notice: Subject to any disclaimer, the term of this patent is extended or adjusted under 35 U.S.C. 154(b) by 382 days.

(21) Appl. No.: 16/234,706

(22) Filed: Dec. 28, 2018

(65) Prior Publication Data

US 2020/0210103 A1 Jul. 2, 2020

(51) Int. Cl.
*G06F 3/06* (2006.01)
*G11C 13/00* (2006.01)

(52) U.S. Cl.
CPC .......... *G06F 3/0659* (2013.01); *G06F 3/0604* (2013.01); *G06F 3/0656* (2013.01); *G06F 3/0673* (2013.01); *G11C 13/0069* (2013.01); *G11C 2213/30* (2013.01)

(58) Field of Classification Search
CPC .... G06F 3/0659; G06F 3/0604; G06F 3/0673; G11C 13/0069
See application file for complete search history.

(56) References Cited

U.S. PATENT DOCUMENTS

| | | | |
|---|---|---|---|
| 9,275,732 B2 | 3/2016 | Chih et al. | |
| 9,471,242 B2 | 10/2016 | Jones et al. | |
| 10,083,751 B1 | 9/2018 | Dallabora et al. | |
| 2011/0051492 A1 | 3/2011 | Toda | |
| 2011/0302367 A1 | 12/2011 | Balkesen et al. | |
| 2014/0286078 A1 | 9/2014 | Katayama | |
| 2016/0224247 A1* | 8/2016 | Woo ........................ | G06F 3/061 |
| 2016/0313931 A1* | 10/2016 | Song .................. | G11C 16/0483 |

* cited by examiner

*Primary Examiner* — Prasith Thammavong
*Assistant Examiner* — Edmund H Kwong
(74) *Attorney, Agent, or Firm* — Brooks, Cameron & Huebsch, PLLC

(57) ABSTRACT

The present disclosure includes apparatuses and methods for buffer reset commands for write buffers. An example apparatus includes a memory and a controller coupled to the memory. The memory can include an array of resistance variable memory cells configured to store data corresponding to a managed unit across multiple partitions each having a respective write buffer corresponding thereto. The controller can be configured to update the managed unit by providing, to the memory, a write buffer reset command followed by a write command. The memory can be configured to execute the write buffer reset command to place the write buffers in a reset state. The memory can be further configured to execute the write command to modify the content of the write buffers based on data corresponding to the write command and write the modified content of the write buffers to an updated location in the array.

19 Claims, 5 Drawing Sheets

MEMORY MANAGEMENT UTILIZING BUFFER RESET COMMANDS

TECHNICAL FIELD

The present disclosure relates generally to semiconductor memory and methods, and more particularly, to memory management utilizing buffer reset commands.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), and magnetic random access memory (MRAM), among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players, for example, MP3 players, and movie players, among other electronic devices. Data, such as program code, user data, and/or system data, such as a basic input/output system (BIOS), are typically stored in non-volatile memory devices.

Resistance variable memory cells can be written (e.g., programmed) to a desired state, such as to one of multiple states. For example, each of the respective multiples states can correspond to a respective threshold voltage (Vt) distribution. A resistance variable memory cell programmed as a single level cell (SLC) can store one of two logical (e.g., binary) data states (e.g., 1 or 0). A resistance variable memory cell programmed as a multi-level cell (MLC) can store more than two logical data states.

In some examples, a lower resistance state can be referred to as a set state (e.g., corresponding to a logical 1), and a higher resistance state can be referred to as a reset state (e.g., corresponding to a logical 0). For example, a cell in the set state can be written (e.g., in place) to a reset state by a reset operation, and a cell in the reset state can be written (e.g., in place) to a set state by a set operation.

Data received from a host at a memory device may be temporarily stored in a buffer (e.g., a write buffer) prior to being written to an array of the memory device. For example, the host may send data to the memory device, and the buffer may store a portion of the data while another portion of the data is being programmed to the array.

DETAILED DESCRIPTION

Figure 1:
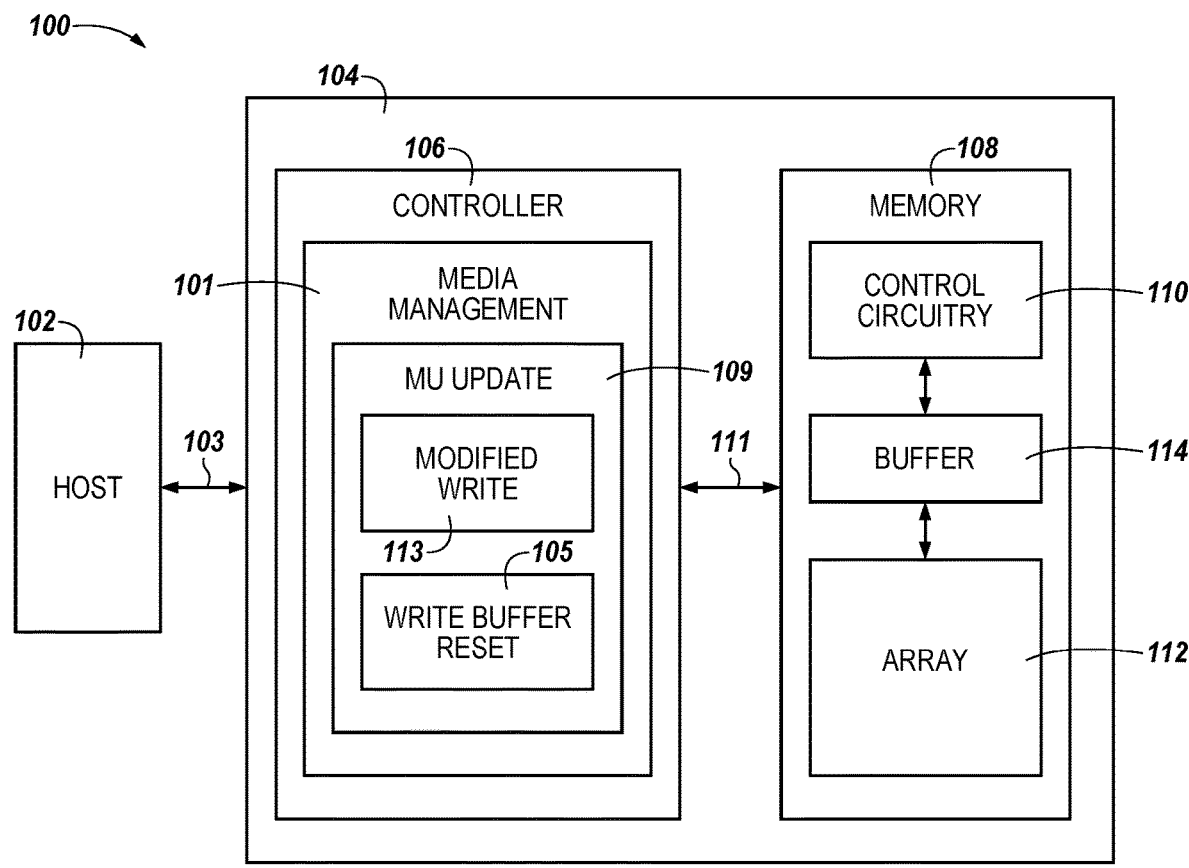
FIG. 1 is a block diagram of an apparatus in the form of a computing system including a memory system capable of performing memory management utilizing buffer reset commands in accordance with a number of embodiments of the present disclosure.

The present disclosure includes apparatuses and methods for memory management utilizing buffer reset commands. An example apparatus includes a memory and a controller coupled to the memory. The memory can include an array of resistance variable memory cells configured to store data corresponding to a managed unit across multiple partitions each having a respective write buffer corresponding thereto. The controller can be configured to update the managed unit by providing, to the memory, a write buffer reset command followed by a write command. The memory can be configured to execute the write buffer reset command to place the write buffers in a reset state. The memory can be further configured to execute the write command to modify the content of the write buffers based on data corresponding to the write command and write the modified content of the write buffers to an updated location in the array.

Various resistance variable memory technologies, such as chalcogenide based technologies (e.g., 3D XPoint), are capable of update in-place media management in which updates (e.g., to data corresponding to logical block addresses (LBAs)) may be performed without moving the data being updated to a different physical location (e.g., physical block address). Media management can involve managing data in chunks, which can be referred to as managed units (MUs). A MU can correspond to a number of logical addresses and can be mapped to a number of physical addresses. As an example, a MU can correspond to a plurality of pages of data (e.g., the size of a MU may be a multiple of a page size corresponding to the memory device).

In-place MU updates can be contrasted with out-of-place MU updates in which the updated data corresponding to the MU is moved to a different (e.g., new) physical location. For example, NAND Flash media management requires out-of-place updates since a physical location must be erased prior to being rewritten (e.g., overwritten).

In some instances, media management within resistance variable memory devices can involve both in-place and out-of-place updates to MUs. For instance, a media management component may manage MUs of different sizes in different manners. As one example, user data (e.g., host data) may be managed in relatively large chunks referred to as large managed units (LMUs), and mapping data such as L2P mappings may be stored in relatively small chunks referred to as small managed units (SMUs). For example, LMUs may have a size of 4 kB and an SMU may have a size of 64 B. The SMUs may be managed via in-place updates, while the LMUs may be managed via out-of-place updates.

For various reasons, it can be beneficial to update LMUs out-of-place even though a particular resistance variable memory technology may be capable of performing in-place updates. For example, since threshold voltage drift can be an issue with some resistance variable memory technologies, it can be beneficial to write updated LMUs to previously "cleaned" LMU locations in which the corresponding cells have all been written to a same particular state (e.g., all "0"s). In this situation, since the cleaned LMU contains all "0"s, only the "1"s of updated data pattern are written to the LMU, which ensures that "1"s are younger (e.g., more recently written) than "0"s in the updated LMU location.

In various prior approaches, in-place updates (e.g., to LMUs) can be performed using a two-phase write command, which may be referred to as a "normal write" (NW) command. The NW command involves a first phase (e.g., pre-read) in which a current data pattern corresponding to a MU is read from the array into a buffer. The second phase of NW command involves comparing the current data pattern with the new data pattern, and then writing back to the array only those bits requiring updating. However, performing the pre-read phase can be costly in terms of time and energy considerations, and it would be beneficial to avoid the need to perform the pre-read in association with performing MU updates, if possible. For example, in situations in which MUs to be updated are being rewritten to "cleaned" MU locations, a need to pre-read the data at the new MU location does not exist, since the data pattern currently stored at the new MU is known (e.g., all "0"s).

In some instances, a write command that does not involve a pre-read phase may be used to write user data to an array. Such a write command that does not involve a pre-read phase may be referred to as a "modified write" (MW) command. However, although a MW command does not involve a pre-read phase, the MW command can still involve mixing of the new user data (e.g., present in a user data buffer) with the content of a write buffer, which would contain a residual data pattern from a prior read operation. As such, each MW command consumes energy in association with comparing the data currently residing in the write buffer (e.g., from the prior read) with the user data to be written via the MW command.

As described further herein below, various embodiments of the present disclosure can involve updating managed units by utilizing a command to place the write buffers of a memory in a reset state (e.g., all "0"s) followed by a number of write commands that do not involve a pre-read phase (e.g., a number of MW commands). The command to place the write buffers in the reset state can be referred to as a write buffer reset (WBR) command. Placing the write buffers in a known state can avoid the energy consumption associated with comparing the data patterns stored in the buffers with the new/updated data to be written to memory. As such, MU updates performed in accordance with embodiments described herein can consume less energy and/or can provide improved latency as compared to prior MU update approaches, among other benefits. Various previous approaches to memory management within resistance variable memories may not have involved utilizing a MW command in association with updating managed units out-of-place.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N" and "M", particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory cells) can refer to one or more memory cells, whereas a "plurality of" is intended to refer to more than one of such things. Furthermore, the words "can" and "may" are used throughout this application in a permissive sense (e.g., having the potential to, being able to), not in a mandatory sense (e.g., required to).

The figures herein follow a numbering convention in which the first digit or digits correspond to the drawing figure number and the remaining digits identify an element or component in the drawing. Similar elements or components between different figures may be identified by the use of similar digits. For example, 114 may reference element "14" in FIG. 1, and a similar element may be referenced as 314 in FIG. 3.

FIG. 1 is a block diagram of an apparatus in the form of a computing system 100 including a memory system 104 capable of performing memory management utilizing buffer reset commands in accordance with a number of embodiments of the present disclosure. The computing system 100 includes a host 102 and a memory system 104. The host 102 can be, for example, a host system, such as a personal laptop computer, a desktop computer, a digital camera, a mobile device (e.g., cellular phone), network server, Internet of Things (IoT) enabled device, or a memory card reader, among various other types of hosts. The memory system 104 can be, for example, a storage system such as an SSD, a UFS device, an eMMC device, etc. However, embodiments are not limited to a particular type of memory system. For example, the memory system 104 could serve as main memory for system 100.

The memory system 104 includes a controller 106 coupled to the host 102 and to a memory 108, which can comprise a number of memory devices (e.g., dies, chips, etc.) providing a storage volume for the memory system 104. The controller 106 can be coupled to the host 102 via host interface 103 and to the memory 108 via memory interface 111 and can be used to transfer data between the memory system 104 and a host 102. The host interface 103 can be in the form of a standardized interface. For example, when the memory system 104 is used for data storage in a computing system 100, the interface 103 can be a serial advanced technology attachment (SATA), peripheral component interconnect express (PCIe), or a universal serial bus (USB), among other connectors and interfaces. In general, the memory system 104 and the host 102 that are coupled to each other via the host interface 103 may each have a compatible receptor for passing control, address, data, and other signals via the host interface 103. Similarly, the controller 106 and the memory 108 may each have a receptor compatible with the memory interface 111. The interface 111 may support various standards and/or comply with various interface types (e.g., DDR, ONFI, NVMe, etc.).

The controller 106 can communicate with the memory 108 to control data read, write, and erase operations, among other operations. The controller 106 can include a media management component 101, which can be responsible for various media management activities such as logical to physical (L2P) address mapping (e.g., of MUs), MU updating, wear leveling, and drift management, among various other operations. The controller 106 and various components thereof, may be implemented in hardware, firmware, and software, or combinations thereof.

In the example shown in FIG. 1, the media management component 101 includes a managed unit (MU) update component 109, which can comprise instructions executable to perform MU updates in accordance with embodiments described herein. As illustrated in FIG. 1 and described further below, the component 109 can utilize modified write (MW) commands 113 and write buffer reset (WBR) commands 105 in association with performing MU updating. For instance, the commands 105 and 113 can be provided to the memory 108 and executed thereby (e.g., via the control circuitry 110) to perform memory management (e.g., MU updating) in accordance with embodiments described herein.

As described further below, the memory 108 can comprise resistance variable memory cells organized in a number of partitions. The memory 108 can be configured to write a page of data to and/or read a page of data from, each of the partitions in parallel utilizing buffers 114. For example, each partition can have a write buffer whose size (e.g., width) corresponds to the page size of the memory 108 (e.g., 16 B, 32 B, 1 kB, etc.). The buffer 114 can comprise a various types of buffers associated with accessing array 112. In various embodiments, the buffers 114 can be registers comprising SRAM cells; however, embodiments are not limited to a particular type of buffer.

Figure 2:
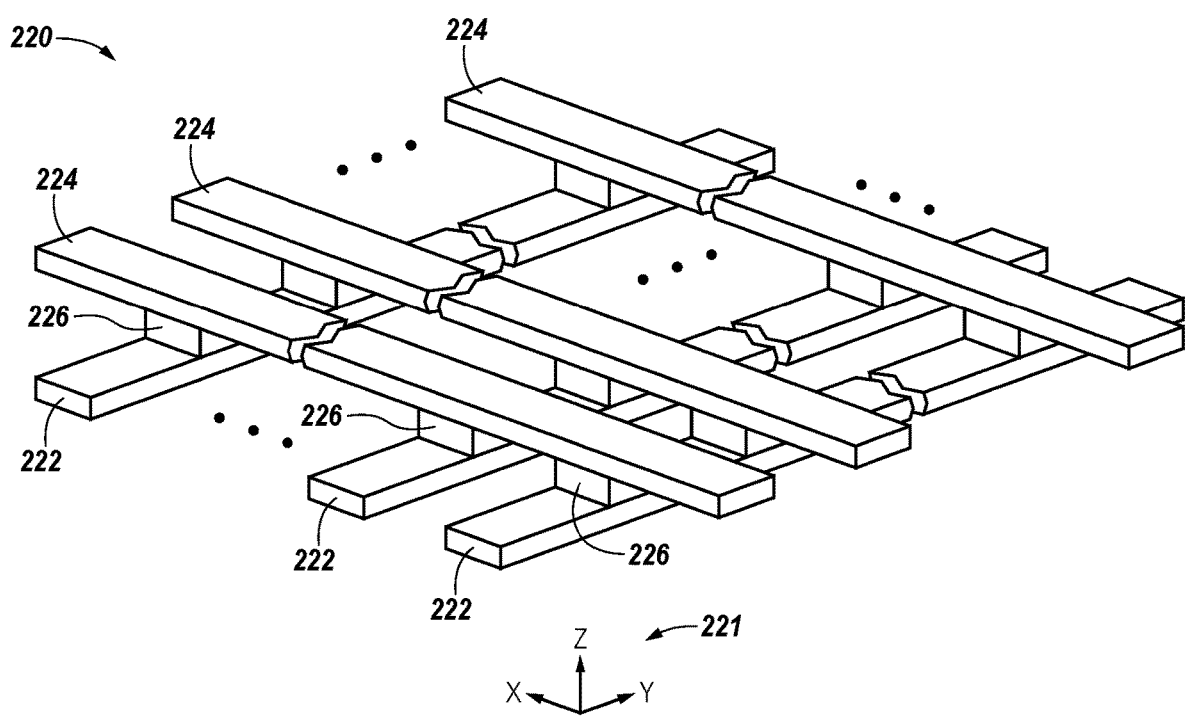
FIG. 2 is a block diagram of a portion of an array of memory cells in accordance with a number of embodiments of the present disclosure.

FIG. 2 is a block diagram of a portion of an array 220 of memory cells in accordance with a number of embodiments of the present disclosure. The array 220 may be a portion of an array of memory cells of the buffer 114 and/or the array 112.

The array 220 is a cross-point array 220 including memory cells 226 between (e.g., at the intersections of) a first plurality of conductive lines 222-0, 222-1, . . . 222-N (e.g., access lines), which may be referred to herein as word lines, and a second plurality of conductive lines 224-0, 224-1, . . . 224-M (e.g., data lines), which may be referred to herein as bit lines. The conductive lines 222-0, 222-1, . . . 222-N and 224-0, 224-1, . . . 224-M can be collectively referred to as conductive lines 222 and 224, respectively. Coordinate axes 221 indicate that the conductive lines 224 are oriented in an x-direction and the conductive lines 222 are oriented in a y-direction, in this example. As illustrated, the conductive lines 222 are substantially parallel to each other and are substantially orthogonal to the conductive lines 224, which are substantially parallel to each other; however, embodiments are not so limited. As used herein, the term "substantially" intends that the modified characteristic need not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

The memory cells 226 arranged in a cross-point architecture can be memory cells of the array 112 and/or the buffer 114 as described in connection with FIG. 1. As an example, the memory cells 226 can be static random access memory (SRAM), phase change random access memory (PCRAM) cells, resistive random access memory (RRAM) cells, conductive random access memory (CBRAM) cells, and/or spin transfer torque random access memory (STT-RAM) cells, and/or 3D cross point memory cells, among other types of memory cells.

In various embodiments, the memory cells 226 can have a "stack" structure including a memory element, which can comprise one or more memory materials. In an embodiment, the memory element can comprise a memory material (e.g., a chalcogenide) that can serve as both a storage element and a switch element, and which may be referred to herein as a switch and storage material (SSM). In another embodiment, the memory element can comprise more than one memory material. For example, the memory element can comprise one memory material that is a switch element and another memory material that is a storage element (e.g., a switch element coupled in series with a storage element). The switch element can be a diode, field effect transistor (FET), a bipolar junction transistor (BJT), an ovonic memory switch (OMS), or an ovonic threshold switch (OTS), among others. In a number of embodiments, one or more memory materials may comprise a chalcogenide alloy; however, embodiments are not so limited.

In a number of embodiments, the switch element and storage element associated with the respective memory cells 226 can be series coupled two-terminal devices. For instance, the switch element can be a two-terminal OTS (e.g., a chalcogenide alloy formed between a pair of electrodes), and the storage element can be a two-terminal phase change storage element (e.g., a phase change material (PCM) formed between a pair of electrodes). A memory cell 226 including an OTS in series with a PCM can be referred to as a phase change material and switch (PCMS) memory cell. In a number of embodiments, an electrode can be shared between the switch element and storage element of the memory cells 226. Also, in a number of embodiments, the conductive lines 224 and the conductive lines 222 can serve as top or bottom electrodes corresponding to the memory cells 226.

As used herein, a storage element refers to a programmable portion of a memory cell 226 (e.g., the portion programmable to different resistance levels corresponding to respective data states). For example, in PCRAM and RRAM cells, a storage element can include the portion of the memory cell having a resistance that is programmable to data states responsive to applied programming signals (e.g., voltage and/or current pulses), for instance. A storage element can include, for instance, a resistance variable material such as a phase change material. As an example, the phase change material can be a chalcogenide alloy such as an indium(In)-antimony(Sb)-tellurium(Te) (IST) material (e.g., $In_2Sb_2Te_5$, $In_1Sb_2Te_4$, $In_1Sb_4Te_7$, etc.) or a germanium(Ge)-antimony(Sb)-tellurium(Te) (GST) material (e.g., $Ge_8Sb_5Te_8$, $Ge_2Sb_2Te_5$, $Ge_1Sb_2Te_4$, $Ge_4Sb_4Te_7$, $Ge_4Sb_4Te_7$, etc.), among other phase change materials. The hyphenated chemical composition notation, as used herein, indicates the elements included in a mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials include transition metal oxide materials or alloys including two or more metals (e.g., transition metals, alkaline earth metals, and/or rare earth metals). Embodiments are not limited to a particular resistive variable material or materials associated with the storage elements of the memory cells 226. For instance, other examples of resistive variable materials that can be used to form storage elements include binary metal oxide materials, colossal magnetoresistive materials, and/or various polymer based resistance variable materials, among others.

Although not illustrated, in a number of embodiments, the array 220 can be part of a three dimensional (3D) cross point memory array, with a plurality of arrays 220 vertically stacked on each other. In such embodiments, conductive lines such as 224 can serve as a bit line for one level of the 3D cross point memory array and as a word line for a subsequent level of the 3D cross point memory array, for instance.

Resistance variable memory cells are rewritable as compared to floating gate cells of NAND memory array. For example, a particular data pattern can be programmed to a group of resistance variable memory cells without necessarily erasing data previously stored in the group. Accordingly, a group of resistance variable memory cells can be updated in place, which refers to rewriting the group of memory cells by overwriting them without first erasing them.

Figure 3:
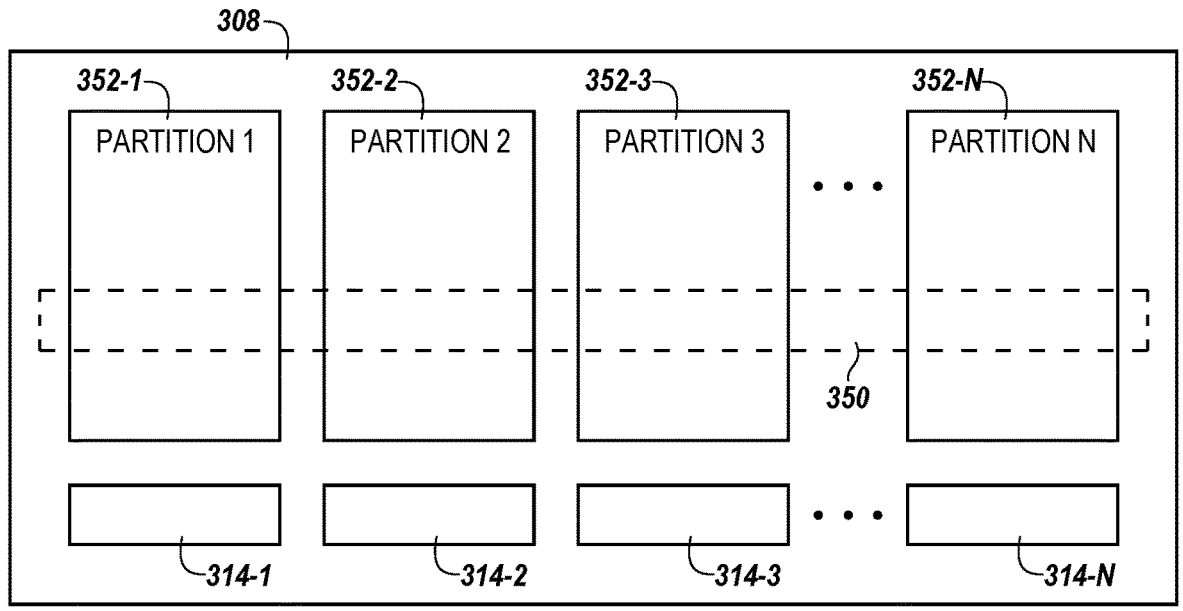
FIG. 3 illustrates a block diagram of an example memory in accordance with a number of embodiments of the present disclosure.

FIG. 3 illustrates a block diagram of an example memory 308 in accordance with a number of embodiments of the present disclosure. The memory 308 may be analogous to the memory 108 described in connection with FIG. 1. As described in connection with FIG. 3, the memory 308 may include a plurality of partitions 352-1, . . . 352-N (e.g., collectively referred to as partitions 352), which may be at least a portion of the array 112 described in connection with FIG. 1.

The memory 308 may include a plurality of managed units, an example managed unit 350 of which is illustrated in FIG. 3. For example, the managed unit 350 may include at least a respective portion of each of the partitions 352 such that data corresponding to the managed unit 350 are stored across multiple partitions. As an example, the managed unit 350 may include 256 pages (e.g., each having 16 bytes (B) pages such that the managed unit 350 correspond to a size of 4 kB (256*16 B)), which are spread across the partitions 352. Accordingly, in an example where the array 308 includes 32 partitions, 256 pages of the managed unit 350 may be spread across the 32 partitions, which results in 8 pages of each of the partitions (e.g., partitions 352) being allocated for the managed unit 350 (256 pages/32 partitions=8 pages per each partition).

Each of the partitions 352 may have (e.g., be coupled to) a respective one of a plurality of write buffers 314-1, . . . 314-N (e.g., collectively referred to as write buffers 314). When a host data pattern is received from the host 102, the controller 106 may provide a command (e.g., modified write command 113) to write the received host data pattern first to the write buffers 314 and to the partitions 352 as a managed unit (e.g., managed unit 350). For example, the host data pattern corresponding to the managed unit 350 may be written as segments to the write buffers 314 (such that each segment is stored in a respective write buffer) and each segment may be further written from each one of the write buffers 314 to a respective one of the partitions 352. Accordingly, writing an individual host data pattern corresponding to a managed unit may comprise providing N number of commands (e.g., modified write command 113) to store N number of data segments of the managed unit across N number of write buffers and subsequently across N number of partitions. Further details of sequences associated executing command such as write buffer reset commands 105 and/or modified write commands 113 are described in connection with FIGS. 4A and 4B.

Figure 4A:
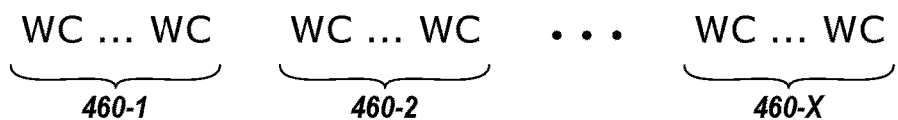
FIG. 4A illustrates an example command execution sequence for performing memory management utilizing a number of write commands in accordance with a prior approach.
Figure 4B:
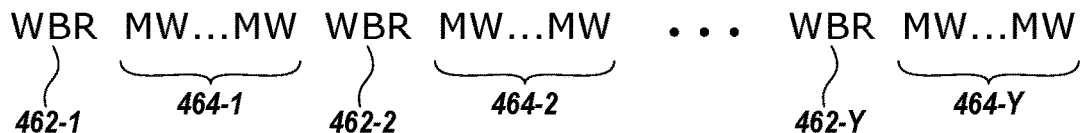
FIG. 4B illustrates an example command execution sequence for performing memory management utilizing buffer reset commands in accordance with a number of embodiments of the present disclosure.

FIGS. 4A and 4B illustrate example command execution sequences that can be used to perform memory management (e.g., MU updating). Each of modified write commands (MWs) and write buffer reset commands (WBRs) may correspond to the modified write command 113, and the write buffer reset command 105, respectively, as described in connection with FIG. 1.

Writing a host data pattern to partitions (e.g., partitions 352) as a managed unit (e.g., managed unit 350) involves writing each of data segments of the host data pattern first to a respective one of write buffers (e.g., write buffers 314) and to a respective one of the partitions 352. For example, writing a first host data pattern involves executing a first set of write commands (WCs) 460-1 or modified write commands (MWs) 464-1 and writing a second host data pattern involves executing a second set of WCs 460-2 or MWs 464-2. As such, for writing each host data pattern, a particular number of WCs or MWs may be executed (e.g., by the control circuitry 110). As an example, assuming that a managed unit is stored across N number of partitions, N number of WCs or MWs may be executed for writing an individual host data pattern corresponding to the managed unit.

FIG. 4A illustrates an example command execution sequence for performing memory management utilizing a number of write commands (WCs) in accordance with a prior approach. Each WC of the sets 406 may have two phases associated with writing a host data pattern to the write buffers 314. During a first phase, the WC may read (e.g., pre-read) a data pattern stored in the write buffers 314 and, during a second phase, change data states of only those cells of the write buffers 314 to be programmed to different data states (e.g., a reset state to a set state and vice versa). Accordingly, executing a set of the WCs (including N number of WCs) to write the host data pattern to the write buffers 314 involves performing N number of pre-read operations, which may result in latencies and energy consumption associated with executing the WCs.

FIG. 4B illustrates an example command execution sequence for performing memory management utilizing buffer reset commands in accordance with a number of embodiments of the present disclosure. The example sequence shown in FIG. 4B describes performing a MU update using write buffer reset commands (WBRs) and modified write commands (MWs). As described herein, writing an individual host data pattern may involve executing a set of MWs 464. In a number of embodiments, each set of the MWs 464 may be preceded by each of WBRs 462-1, 462-2, . . . 462-Y (e.g., collectively referred to as WBRs 462). For example, the WBR 462-1 may be executed on the write buffers 314 prior to executing a first set of the MWs 464-1 on the write buffers 314, the WBR 462-2 may be executed on the write buffers 314 prior to executing a second set of the MWs 464-2 on the write buffers 314, and the WBR 462-3 may be executed on the write buffers 314 prior to executing a Yth set of the MWs 464-Y on the write buffers 314.

The buffer reset commands 462 can place all (e.g., storage locations of) write buffers 314 of in a same state (e.g., reset state). Accordingly, the sets of MWs 464 can be executed without pre-reading the write buffers 314. For example, since it is known that all storage locations of the write buffers 314 are in a reset state, the MWs executed on the write buffers 314 may simply need to, without pre-reading the write buffers 314, identify which storage location of the write buffers 314 needs to be programmed to a set state. Accordingly, unlike the sets of WCs 460, the sets of MWs 464 executed on the write buffers 314 can avoid latencies associated with pre-reading the data pattern stored in the write buffers 314.

Figure 5:
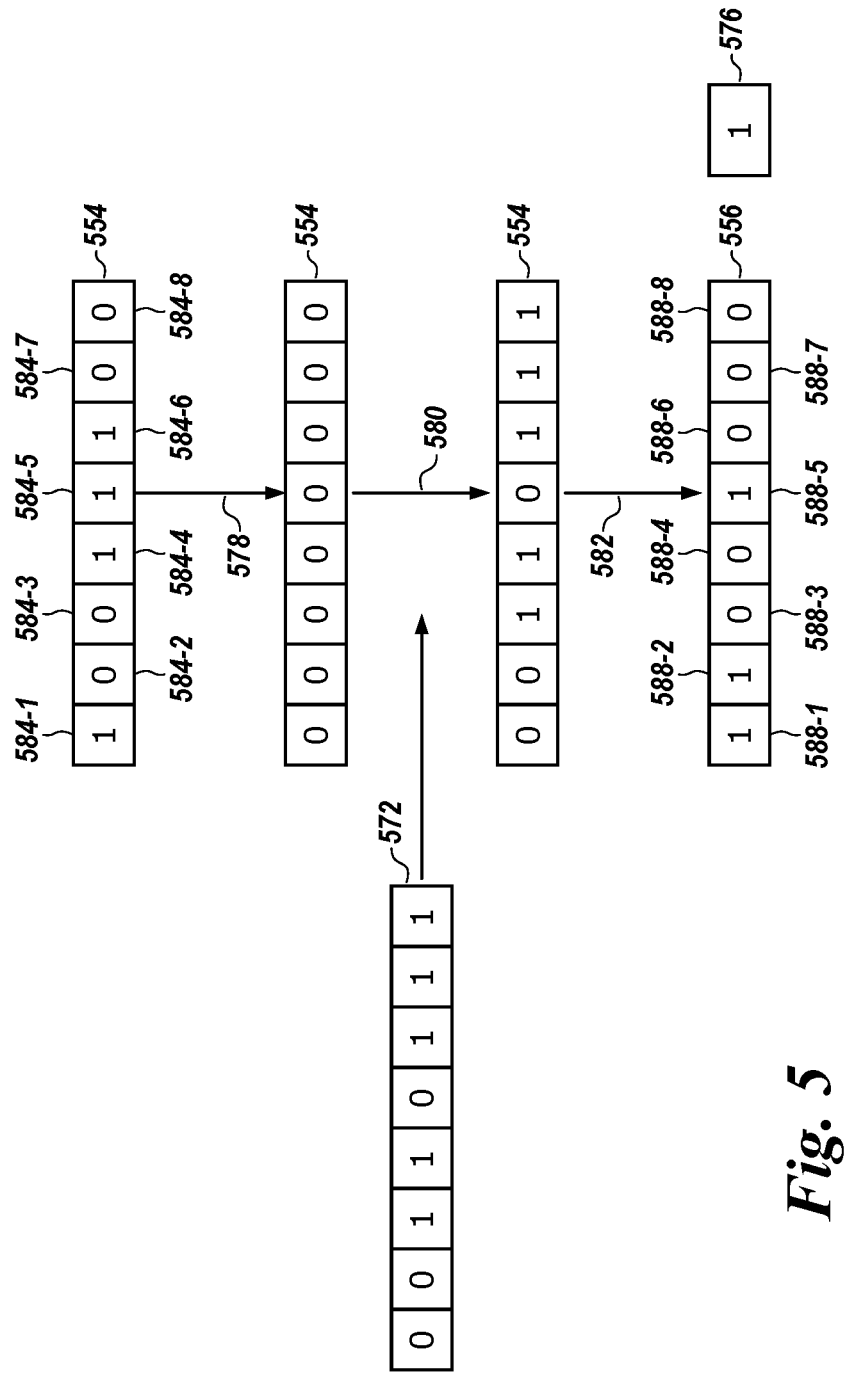
FIG. 5 illustrates data patterns associated with an example sequence for performing memory management utilizing buffer reset commands in accordance with a number of embodiments of the present disclosure.

FIG. 5 illustrates data patterns associated with an example sequence for performing memory management utilizing buffer reset commands in accordance with a number of embodiments of the present disclosure. For example, FIG. 5 illustrates an example of a write without pre-read, such as in response to the write buffer reset command 105 followed by the modified write commands 113. As described herein, the write buffer reset command 105 and the modified write commands 113 can be received at the control circuitry 110 from the controller 108 that is external to the memory 108.

In response to receiving the write buffer reset command 105, the control circuitry 110 can place all write buffers in a reset state. For example, data values of buffer segments 584-1, . . . 584-8 (e.g., collectively referred to as buffer segments 584) are placed in 0s in response to the write buffer reset command 105. Buffer segments 584-1, . . . 584-8 respectively correspond to memory cells 588-1, . . . 588-8.

Subsequent to the execution of the write buffer reset command 105, the modified write command 113 can be executed to write the host data pattern 572 first to the write buffers 554. For example, a write operation 580 writes the host data pattern 572 (e.g., 00110111) in place by only writing to those storage locations that are to be written to a logical 1, which can reduce energy consumption and improve energy efficiency. In the example shown by FIG. 5, only buffer segments 584-3, 584-4, 584-6, 584-7, and 584-8 are programmed to the reset state, while other buffer segments 584-1, 584-2, and 584-3 are not further programmed. As a result, the write buffers 554 stores a data pattern of "00110111" (as shown by 586-3).

Subsequent to performing the write operation 580, the control circuitry 110 can continue executing the modified write command 113 by writing the inverted host data pattern (11001000) from the write buffers 554 to the array 556. For example, the control circuitry 110 determines that there are more logical 1s (five) than logical 0s (three) in the host data pattern 572, and therefore performs a pattern inversion on a pattern stored in the buffer 554 to create an inverted pattern (e.g., 11001000). Upon inverting the pattern stored in the buffer 554, the control circuitry 110 can perform a write operation 582 to write the inverted host data pattern (e.g., 11001000) to a target group of memory cells 588-1, . . . 588-8 (e.g., collectively referred to as memory cells 588), which respectively correspond to the buffer segments 584-1, . . . 584-8. The memory cells 588 can also correspond to a managed unit (e.g., managed unit 350) that can be stored across multiple partitions (e.g., partitions 452) of the array 112. As a result of the write operation 582, the memory cells 588 stores the inverted host data pattern of "11001000" (as shown by 586-4).

An inversion indicator, such as a flag 576, can be written to indicate whether the host data pattern written from the write buffers 554 is an inverted pattern. For example, the flag 576 can be a logical data value, such as a logical 0 to indicate no inversion or a logical 1 to indicate inversion. In the example of FIG. 5, the flag is set to a logical 1, in that a data pattern received from the write buffers 554 is in an inverted form.

In a number of embodiments, the memory cells 588 may be resistance variable memory cells. Resistance variable memory cells can be rewritten by overwriting them without first erasing them, in some examples. This can be referred to as writing in place. In some examples, resistance variable memory cells can be written out of place to a new location after the new location has been "cleaned" by writing all the cells previously in the set state to the reset state, so that all the cells are in the reset state. In an example illustrated in FIG. 5, the memory cells 588 may be a location selected from a plurality of locations of the array 112 having a cleaned status. For example, prior to writing the inverted host data pattern, the memory cells 588 may be cleaned to store a data pattern of "00000000". Accordingly, the memory cells 588 can be written (e.g., updated) out-of-place and the out-of-place update can be performed without reading a data pattern stored in the memory cells 588.

Figure 6:
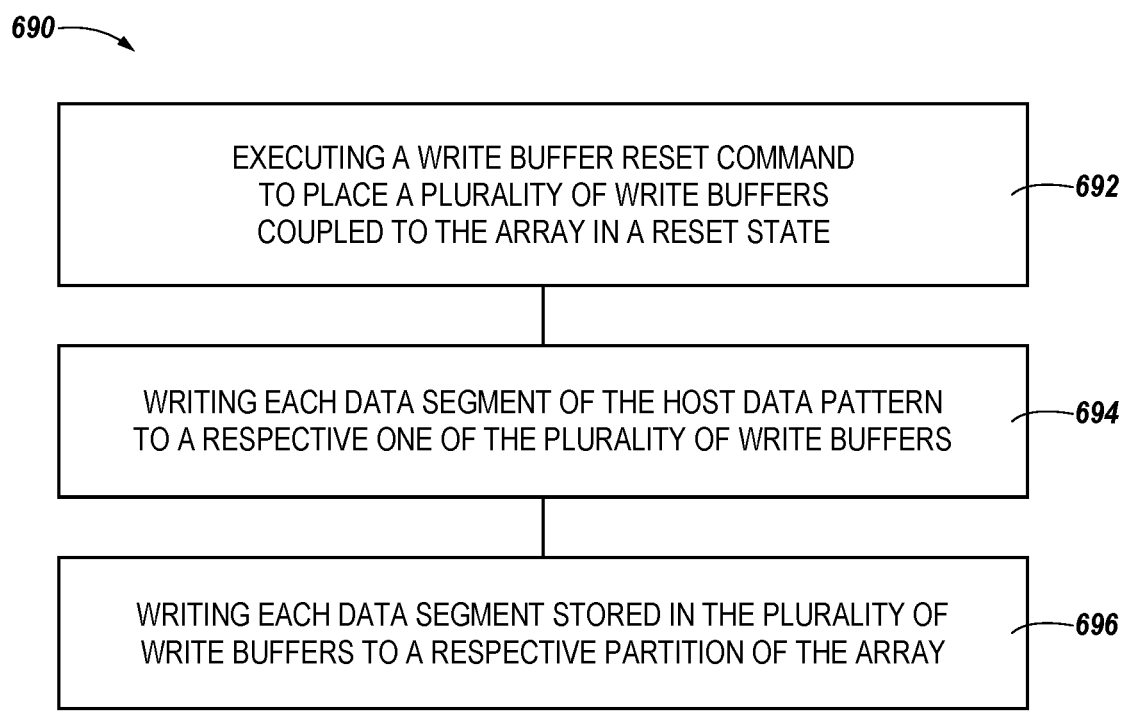
FIG. 6 illustrates a flow chart illustrating an example method for performing memory management utilizing buffer reset commands in accordance with a number of embodiments of the present disclosure.

FIG. 6 illustrates a flow chart illustrating an example method 690 for executing write buffer reset commands and modified write commands in accordance with a number of embodiments of the present disclosure. The write buffer reset command and the modified write command may be analogous to the write buffer reset command 105 and the modified write command 113 previously described in connection with FIG. 1. The method 690 can be performed by, for example, the control circuitry 110 previously described in connection with FIG. 1.

At block 692, the write buffer reset command can be executed in response to receiving a host data pattern to be written to an array. For example, the write buffer reset command can be executed by modifying a data pattern previously stored across a plurality of write buffers such that all data values of the modified data pattern are placed in a same state. A plurality of modified write commands can be executed subsequent to executing the write buffer reset command. The host data pattern may be separated into a number of data segments, and each of the plurality of modified write commands may include a respective data segment of the host data pattern.

At block 694, each data segment of the host data pattern can be written (e.g., first write operation), as a result of executing the plurality of modified write commands, to a respective one of the plurality of write buffers. Each data segment of the host data pattern can be written to a respective one of the plurality of write buffers without first determining data states of a data pattern previously stored across the plurality of write buffers. Only those write buffers currently in a set state can be changed to a reset state. For example, reset signals can be applied to only the write buffers that are in the set state.

In some embodiments, the write buffer reset command can be executed independently of the host 102. Stated alternatively, a data pattern being written to the write buffers by executing the write buffer reset command is a non-host data pattern that is generated independently from the host 102.

At block 696, each data segment stored in the plurality of write buffers can be written (e.g., second write operation) to a respective partition of the array such that the data segments of the host data pattern are stored across the plurality of partitions as a managed unit. In some embodiments, the method 690 can include performing the first write operation and the second operation at different respective data transfer rates.

A number of embodiments of the present disclosure can provide benefits such as reducing/eliminating energy consumption associated with pre-reading write buffers prior to writing a host data pattern to the write buffers. This is particularly beneficial when there N number of commands that write the host data pattern to N number of write buffers. For example, an amount of energy consumed by the memory device in executing a write command that pre-read a respective write buffer may increase proportional to a quantity of write commands to be executed for a quantity of write buffers. Therefore, by providing a mechanism of eliminating the need to pre-read the write buffers, the memory device can reduce a substantial amount of energy consumption associated with pre-reading the write buffers regardless of a quantity of write commands to be executed for a quantity of write buffers.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory comprising an array of resistance variable memory cells configured to store data corresponding to a managed unit across comprising X pages that are distributed across Y partitions each having a respective write buffer corresponding thereto, wherein X and Y are positive integers greater than 1; and
   a controller coupled to the memory and configured to update the managed unit by providing, to the memory, X write buffer reset commands, wherein each one of the X write buffer reset commands is followed by Y write commands;
   wherein the memory is configured to:
      execute each one of the X write buffer reset commands to place the write buffers in a reset state; and
      execute the Y write commands per each one of the X write buffer reset commands to:
         modify the content of the write buffers based on data corresponding to the Y write commands; and
         write the modified content of the write buffers to an updated location in the array.

2. The apparatus of claim 1, wherein the modified content is one of a host data pattern and an inverse of the host data pattern, and wherein the controller is configured to:
   responsive to determining that the host data pattern includes at least a threshold quantity of data units having a particular data value, perform a pattern inversion to result in the inverse of the host data pattern.

3. The apparatus of claim 1, wherein the updated location comprises a different physical location such that the managed unit is updated out-of-place.

4. The apparatus of claim 1, wherein the memory is configured to update the managed unit without reading data from the array.

5. The apparatus of claim 1, wherein the managed unit is a first type of managed unit configured to be updated out-of-place, and wherein the controller is configured to manage managed units of a second type via in-place updates.

6. The apparatus of claim 1, wherein the updated location in the array is selected from among a plurality of locations having a cleaned status.

7. The apparatus of claim 1, wherein:
   the memory is configured to execute the X write buffer reset and Y write commands via control circuitry internal to the memory;
   the X write buffer reset and Y write commands are received from a controller external to the memory via a memory interface; and
   the memory is configured to execute the Y write commands without reading data from the array.

8. An apparatus, comprising:
   an array of resistance variable memory cells configured to store data corresponding to a managed unit comprising X pages that are distributed across a plurality of Y partitions, wherein X and Y are positive integers greater than 1;
   a plurality of Y write buffers, each of the plurality of Y write buffers corresponding to a respective one of the plurality of Y partitions of the array; and
   control circuitry coupled to the array and to the plurality of Y write buffers and configured to:
      in response to receipt of a single write buffer reset command, execute the write buffer reset command to place the plurality of Y write buffers in a first state; and
      in response to receipt of a plurality of Y write commands following the write buffer reset command, execute the plurality of Y write commands by:
         writing a data pattern corresponding to the plurality of write commands to a respective one of the plurality of Y write buffers; and
         writing the data pattern from each of the plurality of Y write buffers to a respective one of the plurality of Y partitions such that the host data pattern is stored across the plurality of Y partitions as a managed unit.

9. The apparatus of claim 8, wherein the control circuitry is configured to execute the plurality of write commands without comparing the data pattern corresponding to the plurality of write commands with a data pattern previously stored across the plurality of Y write buffers.

10. The apparatus of claim 8, wherein the control circuitry is configured to write only storage locations of the plurality of Y write buffers determined to be in a second state.

11. The apparatus of claim 10, wherein the first state corresponds to a resistance state having a higher resistance level than the second state.

12. The apparatus of claim 8, wherein the control circuitry is configured to control data states of storage locations of the plurality of Y write buffers independently from a host.

13. The apparatus of claim 8, wherein the array is a three-dimensional (3D) cross point memory array comprising chalcogenide based memory cells.

14. A method, comprising:
in response to receiving a host data pattern corresponding to a managed unit comprising X pages that are distributed across a plurality of Y partitions each having a respective write buffer corresponding thereto, wherein X and Y are positive integers greater than 1, wherein the managed unit is stored in an array of resistance variable memory cells and which is to be updated:
executing a single write buffer reset command to place a plurality of Y write buffers coupled to the array in a reset state such that the plurality of Y write buffers all store a same data pattern; and
subsequent to executing the write buffer reset command, executing a plurality of Y modified write commands each comprising a respective data segment of the host data pattern by:
writing each data segment of the host data pattern to a respective one of the plurality of Y write buffers; and
writing each data segment stored in the plurality of Y write buffers to a respective partition of the array such that the data segments of the host data pattern are stored across the plurality of Y partitions as an updated managed unit.

15. The method of claim 14, wherein:
writing each data segment of the host data pattern to the respective one of the plurality of Y write buffers is a first write operation; and
writing each data segment stored in the plurality of Y write buffers to the respective partition of the array is a second write operation; and
wherein the method further comprises performing the first write operation and the second write operation at different respective data transfer rates.

16. The method of claim 14, wherein executing the write buffer reset command comprises writing a non-host data pattern to the plurality of Y write buffers.

17. The method of claim 14, wherein executing the plurality of modified write commands comprises writing each data segment of the host data pattern to a respective one of the plurality of Y write buffers without first determining data states of a data pattern previously stored across the plurality of Y write buffers.

18. The method of claim 14, wherein executing the plurality of modified write commands comprises writing each data segment stored in the plurality of Y write buffers to a respective partition of the array without first determining data states of a data pattern previously stored in each partition.

19. The method of claim 14, wherein executing the plurality of modified write commands comprises writing each data segment stored in the plurality of Y write buffers to a respective partition of the array having a cleaned status, and wherein memory cells of the respective partition having the cleaned status are in a same resistance state.

* * * * *